US006935201B2

(12) United States Patent
Abraham et al.

(10) Patent No.: US 6,935,201 B2
(45) Date of Patent: Aug. 30, 2005

(54) MEASUREMENT CONFIGURATION INCLUDING A VEHICLE AND METHOD FOR PERFORMING MEASUREMENTS WITH THE MEASUREMENT CONFIGURATION AT VARIOUS LOCATIONS

(75) Inventors: Michael Abraham, Mainz (DE); Eckhard Marx, Radeburg (DE)

(73) Assignees: Infineon Technologies AG, Munich (DE); NanoPhotonics AG, Mainz (DE)

(*) Notice: Subject to any disclaimer, the term of this patent is extended or adjusted under 35 U.S.C. 154(b) by 0 days.

(21) Appl. No.: 10/638,599

(22) Filed: Aug. 11, 2003

(65) Prior Publication Data

US 2004/0050189 A1 Mar. 18, 2004

Related U.S. Application Data

(63) Continuation of application No. PCT/EP01/15346, filed on Dec. 27, 2001.

(30) Foreign Application Priority Data

Feb. 10, 2001 (EP) .............................................. 01103176

(51) Int. Cl.$^7$ .............................................. G01M 19/00
(52) U.S. Cl. .................................................... 73/865.8
(58) Field of Search ..................... 73/865.8; 198/339.1; 312/1; 414/935

(56) References Cited

U.S. PATENT DOCUMENTS

| | | | | |
|---|---|---|---|---|
| 4,667,580 A | * | 5/1987 | Wetzel ....................... 454/187 |
| 4,851,018 A | * | 7/1989 | Lazzari et al. ................. 55/356 |
| 4,886,412 A | * | 12/1989 | Wooding et al. ......... 414/416.05 |
| 4,923,352 A | * | 5/1990 | Tamura et al. ......... 414/225.01 |
| 5,054,988 A | * | 10/1991 | Shiraiwa ..................... 414/404 |
| 5,280,431 A | * | 1/1994 | Summerville et al. ......... 701/24 |
| 5,331,458 A | * | 7/1994 | Bacchi et al. ................ 359/393 |
| 5,341,130 A | * | 8/1994 | Yardley et al. ............... 340/3.1 |
| 5,364,219 A | * | 11/1994 | Takahashi et al. ........... 414/217 |
| 5,404,111 A | | 4/1995 | Mori et al. |
| 5,431,600 A | * | 7/1995 | Murata et al. ............... 454/187 |
| 5,468,111 A | * | 11/1995 | Flint et al. .............. 414/416.08 |
| 5,655,869 A | * | 8/1997 | Scheler et al. .......... 414/222.01 |
| 5,695,315 A | * | 12/1997 | Doi .......................... 414/798.9 |
| 5,976,199 A | * | 11/1999 | Wu et al. ................... 29/25.01 |
| 6,033,175 A | | 3/2000 | Pflueger et al. |
| 6,364,331 B1 | * | 4/2002 | Yap ........................ 280/47.371 |
| 6,394,523 B1 | * | 5/2002 | Yoo et al. ................. 296/24.32 |
| 6,563,586 B1 | * | 5/2003 | Stanke et al. ................ 356/445 |
| 6,622,057 B1 | | 9/2003 | Ko et al. |

FOREIGN PATENT DOCUMENTS

| | | | | |
|---|---|---|---|---|
| EP | 1239277 A1 | * | 9/2002 | ............ G01N/1/20 |
| JP | 01136346 | | 5/1989 | |
| JP | 05190644 A | * | 7/1993 | ........... H01L/21/68 |
| JP | 09162262 | | 6/1997 | |
| JP | 2003243474 A | * | 8/2003 | ........... H01L/21/68 |
| TW | 127453 | | 1/1990 | |
| TW | 447062 | | 7/2001 | |
| TW | 469553 | | 12/2001 | |
| WO | 99/13318 | | 3/1999 | |

* cited by examiner

Primary Examiner—Hezron Williams
Assistant Examiner—John Fitzgerald
(74) Attorney, Agent, or Firm—Laurence A. Greenberg; Werner H. Stemer; Ralph E. Locher

(57) ABSTRACT

A measurement device, i.e. a metrology tool, and a vehicle are combined to provide a mobile metrology in a fabrication facility. Peripheral equipment such as a device transfer unit, for, e.g., FOUPs in semiconductor manufacturing, an electronic control system with, e.g., a PC, monitor, and keyboard and optionally a vacuum pump is also provided in module frames of the vehicle. The measurement configuration particularly reduces bottleneck situations in equipment qualifying of processing tools during fast ramp-up phases of, e.g., semiconductor manufacturing facilities, thereby saving costs. The construction is based on PGVs or AGVs and allows a fast operation directly at the location of a processing tool. With the possible exception of power supply or operator control, the measurement configuration can operate fully autonomously.

22 Claims, 4 Drawing Sheets

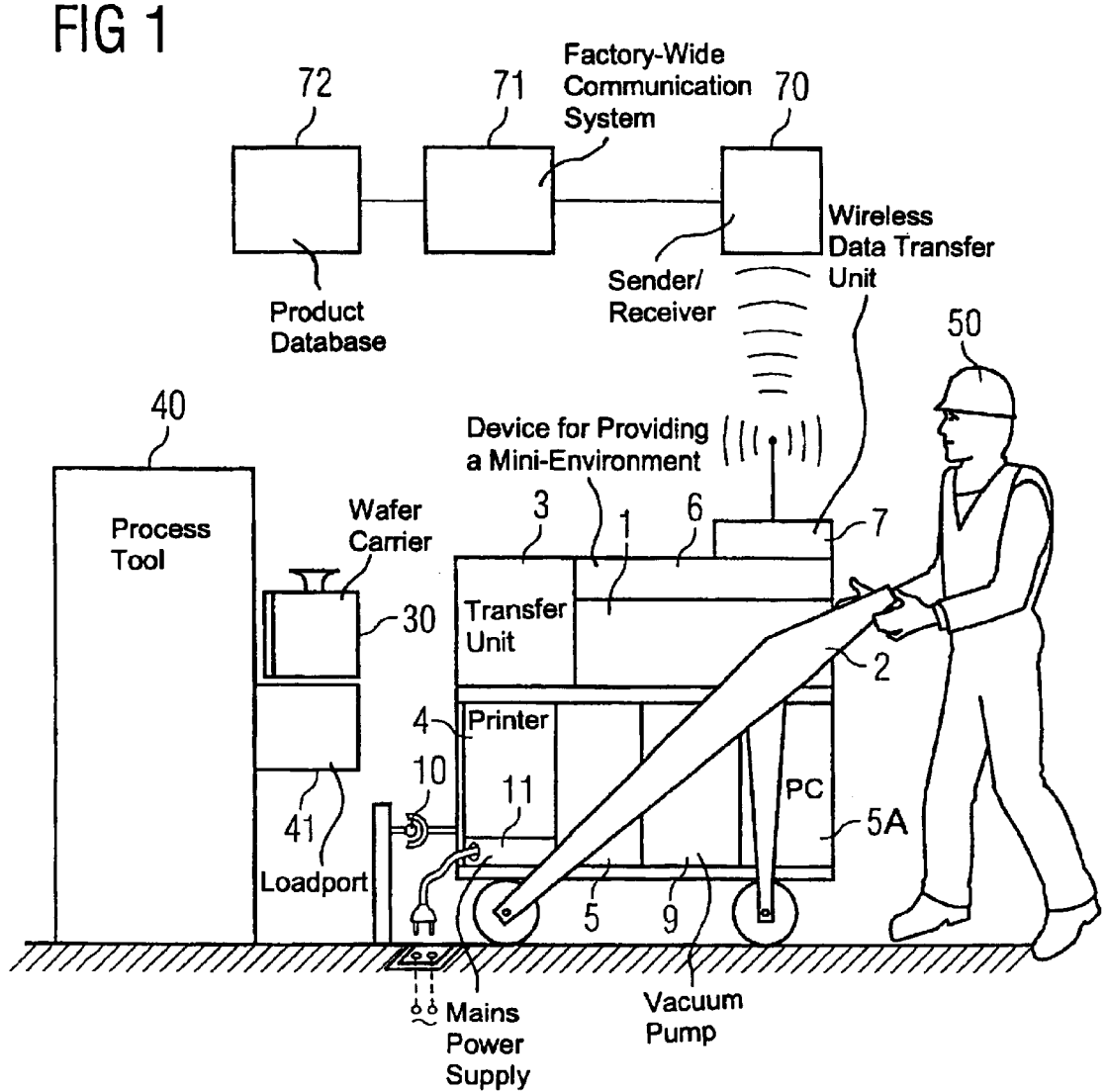

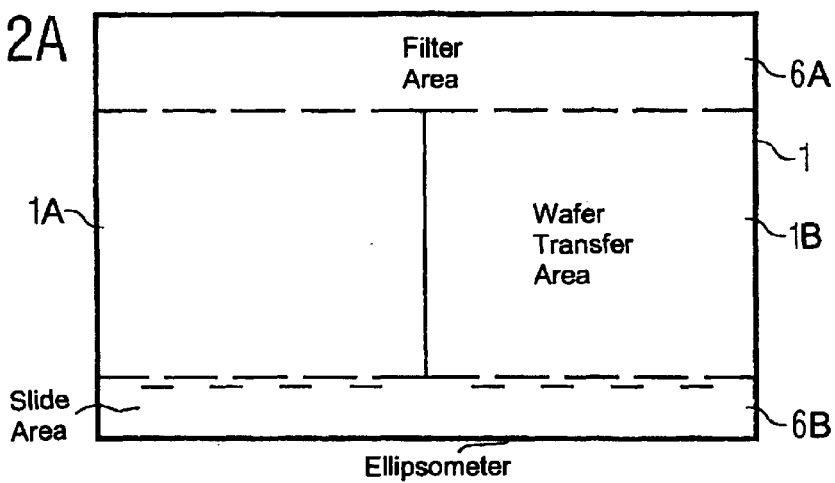
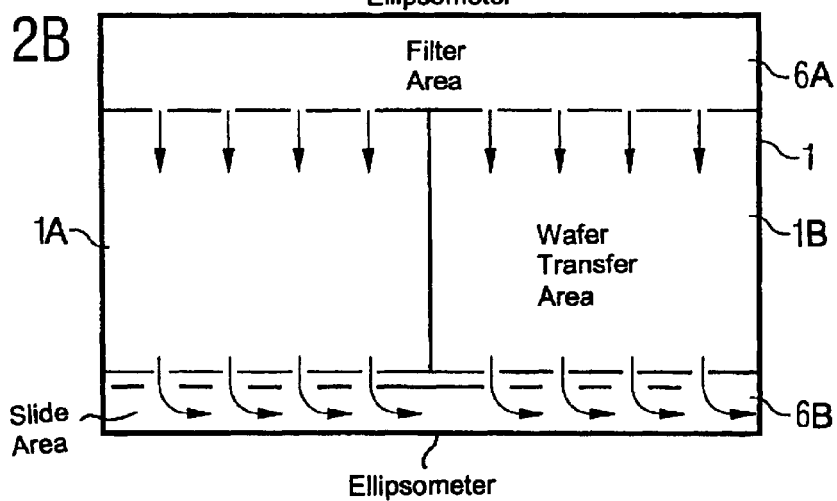
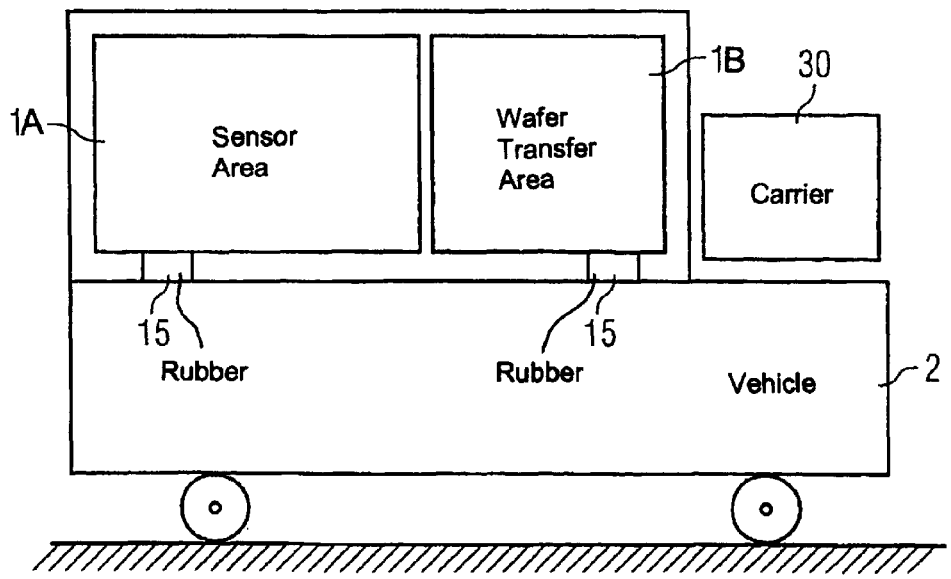

MEASUREMENT CONFIGURATION INCLUDING A VEHICLE AND METHOD FOR PERFORMING MEASUREMENTS WITH THE MEASUREMENT CONFIGURATION AT VARIOUS LOCATIONS

CROSS-REFERENCE TO RELATED APPLICATION

This application is a continuation of copending International Application No. PCT/EP01/15346, filed Dec. 27, 2001, which designated the United States and was published in English.

BACKGROUND OF THE INVENTION

Field of the Invention

The present invention relates to a measurement configuration, for performing a measurement of at least one of a length, width, depth, or position of a structure, a thickness of a film, or a defect, on a plate-like object. The measurement configuration includes a vehicle, a measurement device, an electronic control system, a transfer unit, and a device for providing electrical power.

In the semiconductor manufacturing industry in order to retrieve an optimum Return-on-Invest (ROI), it is necessary to establish a fast ramp-up of new manufacturing facilities. Thereby, it is not only important to save costs by starting the regular production of devices as early as possible, but also to introduce new technologies to the market in a very short time. Besides the time needed to solve the logistic problems associated with a fabrication ramp-up, one main contributor to the ramp-up time is the equipment qualifying during ramp-up. When the test production of devices has started, these devices are inspected using various types of metrology tools, and the process tools involved are either further optimized in their setups or released for mass-production, when specifications are fulfilled.

In production planning performed priorily to the ramp-up phase the capacity of metrology tools is adapted to the manufacturing needs of the process tools in order to preclude non-productive equipment time, thereby saving costs. Unfortunately, because all the equipment, i.e. process tools, is to be qualified within a very short time, a larger metrology capacity is needed during the ramp-up phase than in the following production phase. Therefore, a metrology bottleneck develops during the ramp-up phase, which then inevitably will be prolonged. Thus, the Return-on-Investment is disadvantageously reduced.

In particular, metrology tools configured to inspect 300 mm semiconductor wafers have considerably increased in costs as compared with tools constructed for previous wafer generations, which is due to technology costs as well as clean-room area footprint. Additionally, new metrology tools increasingly complicate the fabrication facility data flow, because due to the tightened specifications large amounts of data have to be exchanged between product specification databases, the work-in-progress system and the clusters of metrology tools. On the contrary, a suitable data flow established in the manufacturing phase is not yet functional in the ramp-up phase. Furthermore, these somewhat cumbersome metrology tools like ellipsometers, particle counters, optical inspection tools, overlay control systems, scanning electron microscopes, etc. provide functionality, that is not needed in the ramp-up phase.

The need for clustering of metrology tools results in large transport distances between a process tool to be qualified and the corresponding metrology tool while the advantages of the metrology tools being a part of the data transfer system and the material storage system could be renounced in the ca-se of the ramp-up phase. The same is valid in the case of system maintenance of a single process tool during the manufacturing phase, where series of test devices are produced and immediately inspected.

SUMMARY OF THE INVENTION

It is accordingly an object of the invention to provide a measurement configuration including a vehicle and a method for performing measurements with the measurement configuration at various locations that overcome the hereinafore-mentioned disadvantages of the heretofore-known devices of this general type and that increase the Return-on-Invest of a semiconductor device fabrication facility during its ramp-up and manufacturing phase with respect to the metrology investment.

With the foregoing and other objects in view, there is provided, in accordance with the invention, a measurement configuration that performs a measurement of a feature of a plate-like object. The measurement configuration includes a measurement device for measuring the feature, in particular, at least one of a length, width, depth, position of a structure, a thickness of a film, or a defect, on said plate-like object, an electronic control system for controlling the measurement device, a transfer unit for providing the plate-like object to the measurement device, a device for providing electrical power to the measurement configuration, and a vehicle provided with spaces. Each of the spaces of the vehicle being for respectively receiving the measurement device, the electronic control system, the transfer unit, and the device for providing a power supply.

The main aspect of the present invention is the combination of a measurement device and a vehicle for transporting the device. By the term measurement device a metrology tool as it is used in semiconductor industry is denoted, e.g. a particle counter, an ellipsometer for measuring the thickness of very thin films down to a few manometers, a reflectometer for measuring the thickness of thin films being thicker than 100 nm e.g. photo resists. The measurement device, or metrology tool, can also be a Fourier transform spectrometer for measuring the thickness particularly of epitaxial films or the concentration of dopants like Boron or contaminations like carbon. Alternatively, it can be a system for measuring the critical dimensions of a semiconductor structures, using optical, scanning electron or other types of microscopes. The measurement device may also be considered to be an overlay control tool measuring the position accuracy of structures, a defect inspection tool or a tool measuring the depth profiles of structures, e.g. scanning electron microscopes (SEM) or atomic force microscopes (AFM).

Modern developments of such metrology tools, e.g. especially in the case of ellipsometers, enable compact and portable configurations for metrology tools having a weight of some tens of kilograms, which is to be compared with some hundreds of kilograms inferred from conventional stand-alone measurement devices. According to the present invention, these compact metrology tools are preferably combined with vehicles, which include wheels and a chassis that is stable enough to carry the metrology tool and its peripherals.

Preferably, the vehicle is a personal guided vehicle (PGV) or an automatic guided vehicle (AGV), which have a structure based on similar vehicles used in cleanroom areas for transporting wafer carriers.

The vehicle includes at least one of shelves, slide-in units, or other plug-in options for receiving the metrology tool and its peripherals. It is therefore adapted in its form to carry the weight and the volume of the equipment. Accordingly, the inserted equipment is fixed, mounted, or just placed and held by gravity inside the vehicle module frames. The vehicle can be guided by an operator or, as in the case of AGVs, be driven by an electric motor, a sensor, and a control unit for detecting the position and controlling the movement.

The configuration additionally includes peripherals necessary to perform a metrological measurement of plate-like objects with the measurement device. One of them is a transfer unit, by which a plate-like object is introduced to the metrology tool on the vehicle. In the case of the plate-like object being a semiconductor wafer, the transfer unit preferably is associated with a carrier plate provided with pins to accurately place and position a wafer carrier on the vehicle in front of the metrology tool. In this preferred configuration, an electrically-driven mechanical device transfers the wafer into the metrology tool, i.e. a automatic wafer handling system.

The plate-like objects are considered to be at least one of semiconductor wafers, masks, or reticles, flat panels, photovoltaic devices, hard disks, DVDs, CD-ROMs, optical data storage devices, or the like. The exact transfer unit configuration may vary from type to type of the plate-like object.

Another peripheral necessary for performing a measurement is the device for providing electrical power. This may be established by at least one of a mains power supply, an on-vehicle accumulator, or on-vehicle batteries. In the first two cases, the vehicle includes an electric plug that can be connected to an external connector.

The measurement configuration further includes an electronic control system that controls the sequence of steps, the system parameters, and the peripheral equipment for performing the measurement. In a preferred embodiment, the electronic control system includes a Personal Computer (i.e. PC) with a keyboard and monitor to facilitate an interaction of the measurement with an operator controlling the metrology step. The PC is connected to the metrology tool via an e.g. SECS/GEM-interface in this embodiment. The automatic handling system is also controlled by the electronic control system.

The measurement configuration according to the present invention advantageously provides a mobile metrology system. The measurement configuration is easily carried to the location, i.e. the process tool, where it is currently needed. In particular, during the ramp-up phase of the fabrication facility time is saved by qualifying process equipment with the pre-sent measurement configuration, because it can be positioned directly in front of the process tool that currently under investigation (qualifying). A series of test wafers can be processed and immediately inspected by the measurement configuration without employing a complicated material storage and transport system. Inspection results are instantaneously fed back to the process equipment operator staff, which can quickly perform the necessary actions, e.g. adjust system parameters etc.

Additionally, the measurement configuration can be advantageously employed for system maintenance. Wafer data, e.g. are collected quickly and the maintenance phase is thus shortened. No external media are required with the exception of power supply.

Therefore, time and costs are saved by the measurement configuration according to the present invention. The ramp-up phase of semiconductor fabrication facilities is shortened by removing the metrology bottleneck, which hitherto was inherent from stand-alone metrology tools. Since the measurement configuration also can be used for production wafers, there is no problem with over-capacity in this phase. Moreover, the measurement configuration could even be transported more easily to the next ramp-up facility. The Return-on-Invest is thus efficiently reduced.

A further aspect considers the plate-like object being a semiconductor wafer or mask. Corresponding manufacturing facilities typically have a considerable ramp-up phase and a complicated material and data flow structure. Moreover, current tools are characterized by high-end specifications, making corresponding stand-alone metrology tools cumbersome. Thus, the present measurement configuration becomes advantageous.

In a further aspect, the vehicle is considered to have a width in the range of 300 up to 1000 millimeters. The width is measured in a direction orthogonal to the direction of movement and parallel to front side of a process tool, when the measurement configuration is placed in front of said process tool for starting the carrier transfer. The length of the configuration is typically longer than its width. This size, which is very similar to that of conventional PGVs or AGVs guarantees advantageously a high degree of mobility in the narrow paths of typical cleanroom configurations. The vehicle, i.e. the measurement configuration, can fast and flexibly be carried to the process tool, where it is needed.

In a further aspect, the vehicle is considered to receive a vacuum pump for supplying the chuck of the measurement device with vacuum for holding the semiconductor wafer. Since the vehicle is controlled autonomously with the exception of the power supply, the vacuum pump is controlled by the electronic control system.

In a further aspect, the vehicle is considered to include a drive for moving, a brake, and steerable wheels. In this form, it very much like an AGV. Therefore, it moves autonomously along predefined paths in the fabrication to the location of a process tool, where it is just needed for a measurement. The position of such a vehicle can be controlled via inductive loops connected to a control unit. The control unit then organizes the necessary steps by managing the drive or the brakes and by steering the wheels in order to reach the destined location, e.g. a process tool.

In a further aspect the use of an accumulator for electrical power supply is considered. This feature advantageously enhances the mobility of the measurement configuration, because no manual power connection provided by an operator is necessary, then. Moreover, the configuration is not dependent on the existence of a free power connector in the vicinity of a measurement location.

In a further aspect the establishment of a mini-environment is considered. It includes a filter system inside the metrology tool for preserving advanced cleanroom conditions inside the metrology tool and the wafer transfer area. A laminar air-flow is also provided.

In a further aspect, a docking/undocking interface for a wafer carrier to the metrology tool is considered. The interface preserves the mini-environment conditions inside the wafer carrier and other metrology tools, which is accomplished by completely enclosing the inner area of the docked system from the outside area.

In a further aspect, an interface for opening or closing the wafer carrier door as being part of the mini-environment is considered. Having docked the wafer carrier to the metrology tool preserving the mini-environment conditions, the wafer carrier door can be opened and the automatic handling system can load the wafer to the metrology tool. In a still further aspect, the docking/undocking interface is considered to include a driving device accurately controlling the docking procedure.

In a further aspect, the vehicle is considered to include a space for receiving a printer being connected to the electronic control system for documenting the measurement.

In a further aspect, the measurement configuration can include a data transfer unit for connecting the electronic control system to a factory-wide communication system, which typically includes access to the product specification data and the lot control system (work-in-progress) and resource tracking of the whole facility. This feature will become advantageous, if the measurement configuration is applied to production wafers in the usual manufacturing phase. The data transfer unit can include a cable connection unit, which can be connected to a local connector at a process tool, where the measurement configuration is currently employed. In a still further aspect, the data transfer unit is considered to includes a device to transfer the data via a wireless communications channel. This feature advantageously renders laborious cable connecting unnecessary. Depending on the surrounding process equipment and the cleanroom specifications, the data transfer can be performed in infrared light, ultrasonic, or on radio frequencies.

In a further aspect, the vehicle is considered to include a vibration damping device for preventing the measurement device from vibration being transmitted by the vehicle. This is important during a measurement, and the material and configuration used depends on the frequencies of the mechanically disturbing oscillation that is wished to be absorbed. One example implementation is to position a granite plate upon rubber material that is mounted on the chassis of the vehicle. Also, pneumatic cylinders and the like can be used to absorb vibration. The granite plate is not necessarily needed.

In a further aspect, a device is considered, to which the vehicle can dock at a location in front of a process tool or at other suitable locations in a fabrication facility. This prevents the vehicle from rolling away if it is accidentally hit, e.g. by an operator. Moreover, the corresponding external docking device marks a predefined location for a vehicle, where it does not disturb other manufacturing processes and cleanroom area traffic.

In a further aspect, the weight of the vehicle carrying the equipment and its peripherals is considered to be in the range of 20 kg to 50 kg. Vehicles having such a weight can be easily controlled by electric motors suitable for cleanroom areas or operator staff. A typical weight of a preferred measurement configuration is about 100 kg.

In a further aspect, a device for controlling the mini-environment during power-off state is considered. The device includes a sensor for detecting missing power supply and immediately stops the air-cycle inside the mini-environment with the laminar air stream. Also, any connection of the air cycle system to the space outside the metrology tool is closed. This preserves the diffusion of contaminating particles into the mini-environment.

In a further aspect, the vehicle is considered to include at least one roller for easily moving the vehicle from one location to another. Cleanroom specific materials are preferably used for the rollers.

In a further aspect, a method for performing a measurement of a feature of a plate-like object using the measurement configuration is considered. It includes the steps of moving the measurement configuration from a first location to the location in front of a loadport of a process tool, loading the plate-like object from the loadport of the process tool to the measuring device using the wafer carrier, performing the measurement on the plate-like object without a physical connection with the exception of at least one of electrical power supply, wireless data transfer or docking connection with the surroundings, unloading the plate-like object from the measuring device using the wafer carrier, moving the measurement configuration to a third location.

Other features that are considered as characteristic for the invention are set forth in the appended claims.

Although the invention is illustrated and described herein as embodied in a measurement configuration including a vehicle and a method for performing measurements with the measurement configuration at various locations, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a partially schematic and partially diagrammatic view showing a first embodiment of the measurement configuration according to the invention carried by an operator to a docking position in front of a process tool;

FIG. 2A is a side view showing a second embodiment of the measuring device with a mini-environment in a status of no power connection;

FIG. 2B is a side view showing the second embodiment of the measuring device having a laminar air-flow during power connection;

FIG. 3 is a partially schematic and partially diagrammatic view showing a vehicle according to the present invention with a measurement device positioned on a vibration-damping device;

DESCRIPTION OF THE PREFERRED EMBODIMENTS

Figure 4A:
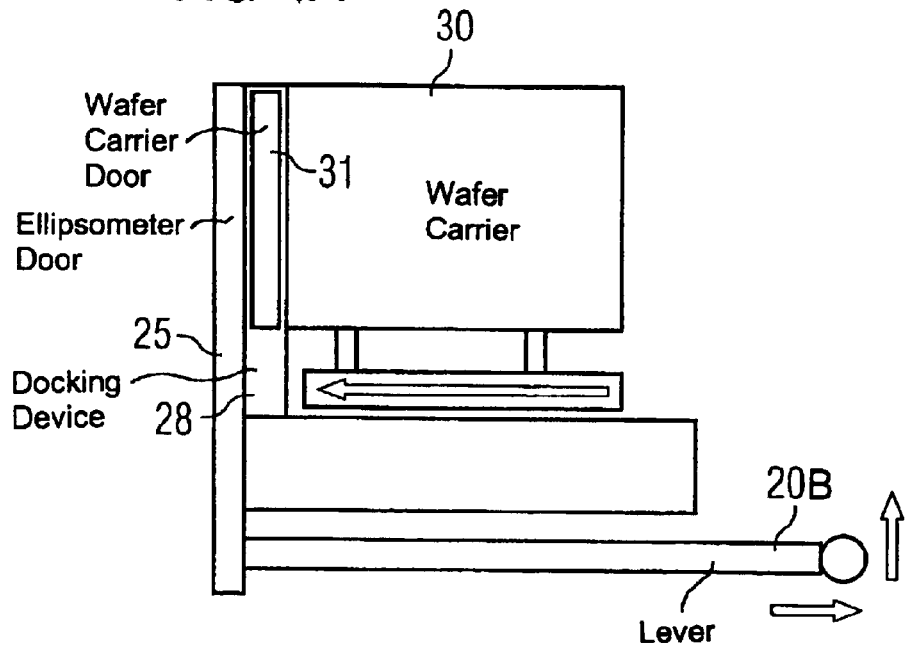
FIG. 4A is a side view showing a door-opening mechanism according to the invention, prior to door-opening.

Referring now to the figures of the drawings in detail and first, particularly to FIG. 1 thereof, there is shown a vehicle with a chassis and a set of four wheels having a basic structure similar to a personal-guided vehicle (PGV) for transporting wafer carriers. The vehicle according to the embodiment of the present invention as shown in FIG. 1 includes a module frame with several spaces for receiving slide-in units. These are an ellipsometer 1 for measuring a film thickness of a semiconductor wafer, a transfer unit 3 that includes a space for receiving a wafer carrier 30, which is a front-opening-unified pod (FOUP), a device for providing a mini-environment inside the wafer carrier 30, and the measurement device 1, i.e. the ellipsometer, a wireless data transfer unit 7, a printer 4, an electronic control system including a personal computer, connected to a keyboard and monitor 5A, a vacuum pump 9 for supplying the vacuum chuck inside the ellipsometer 1, and a mains power supply 11. A docking device 10 is mounted on the vehicle chassis 2, which can be docked to a corresponding docking device mounted to the cleanroom floor in front of a process tool 40 for bringing the measurement configuration into a predefined position in front of a loadport 41 of the process tool 40.

In FIG. 1, an application of an embodiment of the measurement configuration according to the present invention is shown in a situation of typical utilization, e.g. system maintenance, where an operator 50 is about to dock to a docking device 10 and its counterpart on the clean room floor for starting a set of measurements of semiconductor wafers that have been processed in process tool 40, a number of which is transferred to wafer carrier 30, i.e. a FOUP (front opening unified pod). The next step to be performed by the operator 50 is to provide power supply to the equipment mounted on the vehicle 2 by connecting the plug-in of the mains power supply to a connector provided in the cleanroom floor beneath the clean-room floor docking device. In this representative situation, the semiconductor wafers to be inspected are not forwarded by a factory-wide material transport system, because the process tool 40 is in a situation of system maintenance and several test wafers have to be inspected in a short time, while few data have to be exchanged with the factory-wide communication system 71.

The operator 50 then transfers the wafer carrier 30 from the loadport 41 of the process tool 40 to the transfer unit 3 of the measurement configuration. From there, a first semiconductor wafer is automatically loaded to the ellipsometer 1. A low density (i.e. lower than ambient density, preferably cleanroom levels) of contaminating is preserved by the device for providing a mini-environment 6 inside the ellipsometer 1, which is shown in FIGS. 2A and 2B. Prior to being docked by the device for docking the vehicle 10, the measurement configuration has no power connection, such that particles could enter the wafer transfer area 1B and the sensor area 1A of the ellipsometer 1 through the open slides of the slide area 6B, which is part of the air cycle system of the device for providing a mini-environment 6, because there is no laminar air flow through and out off the sensor area 1A and wafer transfer area 1B without power. To circumvent this, the device for providing a mini-environment 6 includes a sensor for detecting electrical power and a set of small slide walls for closing the sensor area 1A and wafer transfer area 1B, if no power supply is detected, which is shown in FIG. 2A.

If the ellipsometer 1 and the device for providing a mini-environment is connected to power the sensor forwards an associated signal to the electronic control system which then opens immediately the set of slide walls of the slide area 6B. At the same time the laminar air flow through the filter area 6A, the wafer transfer area 1B, the sensor area 1A and the slide area 6B starts to cycle, as can be seen in FIG. 2B.

FIG. 3 shows the ellipsometer 1. The ellipsometer 1 includes the sensor area 1A and wafer transfer area 1B is prevented from vibration transferred through the wheels and chassis of the vehicle 2 through a set of rubbers 15, on which the ellipsometer 1 rests. The vibrations may originate from other operators walking on the cleanroom floor in the vicinity of the measurement configuration.

Figure 4B:
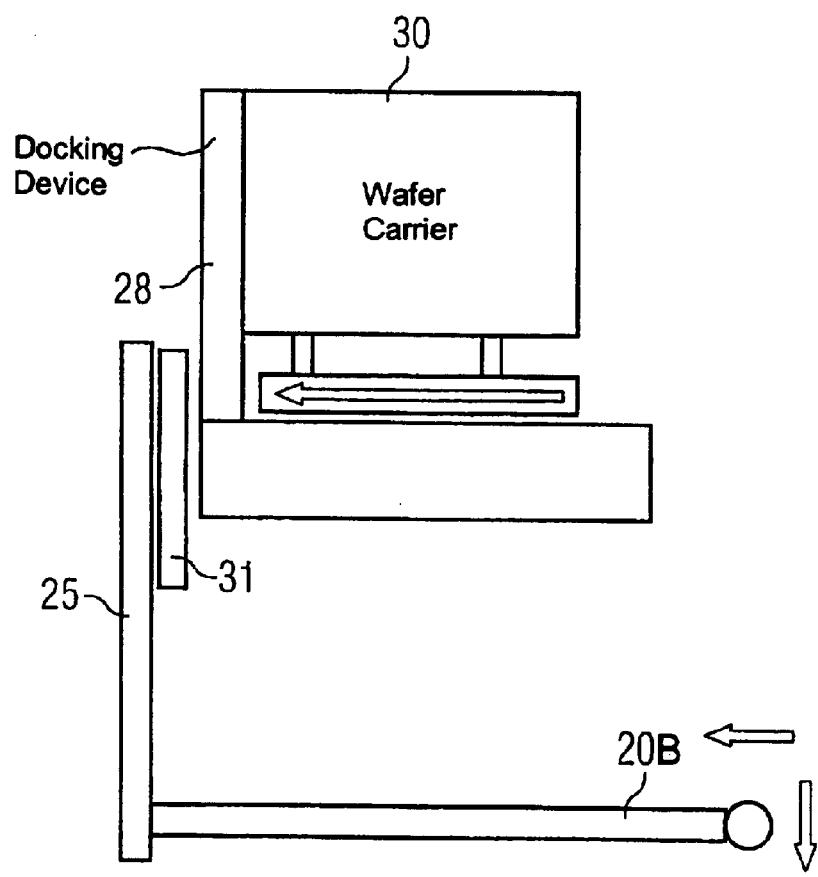
FIG. 4B is a side view showing the door-opening mechanism after door opening using a lever mechanism.

The way of preserving a low density of contaminating particles inside the ellipsometer 1 and the wafer carrier 30 is shown in FIG. 4 in greater detail. In FIG. 4A a wafer carrier 30 is seen to have docked to the docking device 28 of an ellipsometer 1, or the device for providing a mini-environment 6, respectively. The ellipsometer door 25, likewise including the door opener for the wafer carrier door is shown to be in a closed position. Operating the lever 20B into a down-position, the door opener 25 connects to the wafer carrier door 31, unlocks it and both doors are removed from their position, thereby giving the automatic handling system free passage to unload a wafer from the wafer carrier 30 and transferring it to the wafer transfer area 1B and the sensor area 1A, which is shown in FIG. 4B.

Figure 5A:
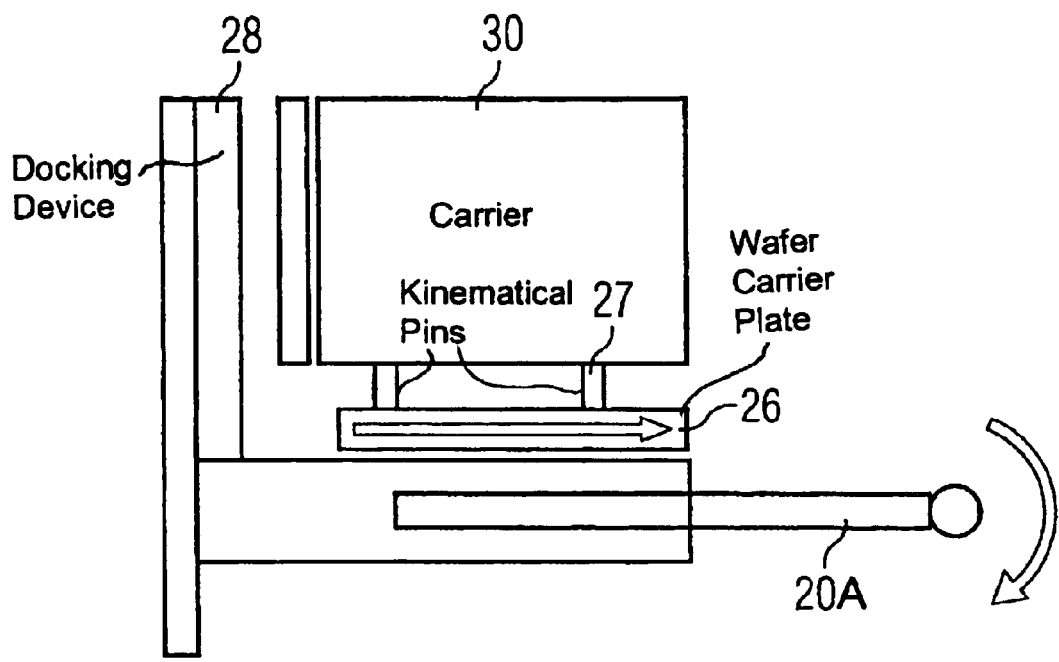
FIG. 5A is a side view showing a wafer carrier docking mechanism using a lever, prior to docking.
Figure 5B:
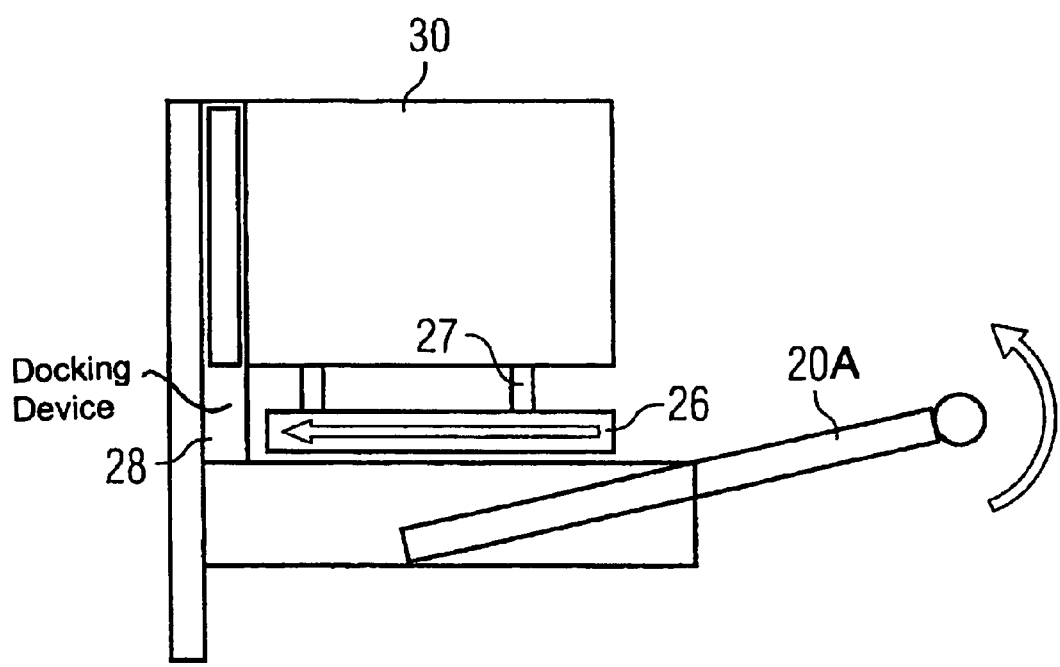
FIG. 5B is a side view showing the wafer carrier docking mechanism using a lever, that has been docked.

The docking device 28 of the device for providing a mini-environment 6 provides a hermetic enclosure of the connected sensor area 1A, wafer transfer area 1B and the inner volume of the wafer carrier 30. In FIG. 5 it is shown how a wafer carrier 30, that is placed on kinematical pins 27 of a wafer carrier plate 26, can be docked to the docking device 28 by using a lever 20A. In FIG. 5A, a situation prior to docking is illustrated, while in FIG. 5B, the lever 20A is lifted by which the carrier plate 26 with the wafer carrier 30 is moved towards the docking device 28 until the wafer carrier docks to the docking device. A sensor can detect this connection and signals a locking of this connection.

Data needed from a product or work in progress database 72 in order to perform a film thickness measurement can be retrieved from a sender or receiver unit 70 of the factory-wide communication system 71 by a wireless infrared communication channel. Data transfer unit 7 transmits or receives the signals to the electronic control system 5. After the measurement corresponding data or work-in-progress transactions can be sent back to the sender or receiver 70, which transfers the information to the CIM system (computer-integrated manufacturing).

We claim:

1. A measurement configuration for measuring a feature of a plate-like object, comprising:
    a measurement device for measuring the feature;
    an electronic control system for controlling said measurement device;
    a transfer unit for providing the plate-like object to said measurement device;
    a device for providing electrical power to the measurement configuration; and
    a vehicle for providing mobility to the measurement configuration, said vehicle including module frames each respectively receiving one of said measurement device, said electronic control system, said transfer unit, and said device for providing electrical power;
    the measurement configuration having a total weight from 20 kg to 150 kg.

2. The configuration according to claim 1, wherein the feature is at least one of a length, a width, a depth, a position of a structure, a thickness of a film, and a defect on the plate-like object.

3. The configuration according to claim 1, wherein said measurement device is selected from the group consisting of a defect inspection tool, an ellipsometer, a particle counter, a reflectometer, a Fourier transform spectrometer, a CD measurement tool, an overlay measurement tool, and a scanning electron microscope.

4. The configuration according to claim 1, wherein the plate-like object is a mask.

5. The configuration according to claim 1, wherein said vehicle provides self-powered movement of the measurement configuration and includes a drive, a brake, and a steerable wheel.

6. The configuration according to claim 1, further comprising a printer connected to said electronic control system, said vehicle being provided with a space for receiving said printer.

7. The configuration according to claim 1, further comprising a vibration damping device for preventing said measurement device from receiving vibration being transmitted by said vehicle.

8. The configuration according to claim 1, further comprising a device for docking said vehicle at a location in a fabrication system.

9. The configuration according to claim 1, wherein said vehicle includes a wheel for rolling said vehicle between two locations.

10. The configuration according to claim 1, wherein the plate-like object is a semiconductor wafer.

11. The configuration according to claim 10, wherein the measurement configuration has a width from 300 millimeters to 1000 millimeters.

12. The configuration according to claim 10, wherein:
said measurement device has a chuck for holding the semiconductor wafer;
a vacuum pump is connected to said chuck; and
said vehicle has a space for receiving said vacuum pump.

13. The configuration according to claim 10, wherein said device for providing electrical power to the measurement configuration includes an accumulator.

14. A method for performing a measurement of a feature of a plate-like object, which comprises the steps:
providing a measurement configuration according to claim 10;
moving the measurement configuration from a first location to a second location before a loadport of a process tool;
loading the plate-like object from the loadport of the process tool to the measuring device using a wafer carrier;
measuring the plate-like object without a physical connection except for at least one of an electrical power supply, a wireless data transfer, and a docking connection;
unloading the plate-like object from the measuring device using the wafer carrier; and
moving the measurement configuration to a third location.

15. The configuration according to claim 1, further comprising a data transfer unit for transferring data between said electronic control system and a factory-wide communication system, said vehicle being provided with a space for receiving said data transfer unit.

16. The configuration according to claim 15, wherein said data transfer unit has a device to transfer the data via a wireless communication channel.

17. The configuration according to claim 10, further comprising a device for providing a mini-environment including a filter system for reducing a density of contaminating particles surrounding the semiconductor wafer during a wafer measurement, said vehicle having a space for receiving said device for providing a mini-environment.

18. The configuration according to claim 17, wherein said device for providing a mini-environment includes:
a sliding area for providing a laminar air flow inside said measurement device;
a sensor for detecting an electrical power connection; and
a device for hermetically enclosing at least a sensor area inside said measurement device and being connected to said sensor for detecting an electrical power connection.

19. The configuration according to claim 17, wherein said device for providing a mini-environment includes an interface for docking and undocking a wafer carrier to said measurement device to preserve a low density of the contaminating particles surrounding the semiconductor wafer during a wafer transfer.

20. The configuration according to claim 19, wherein said interface for docking and undocking includes an electrical driving device.

21. The configuration according to claim 19, wherein:
said wafer carrier has a wafer carrier door; and
said device for providing a mini-environment includes an interface for opening and closing said wafer carrier door.

22. The configuration according to claim 21, wherein said interface for opening and closing a wafer carrier door includes an electrical driving device.

* * * * *